United States Patent
Ji et al.

(10) Patent No.: US 10,763,800 B2
(45) Date of Patent: Sep. 1, 2020

(54) SEMICONDUCTOR DEVICE AND MANUFACTURING METHOD THEREOF

(71) Applicant: MagnaChip Semiconductor, Ltd., Cheongju-si (KR)

(72) Inventors: Hee Hwan Ji, Cheongju-si (KR); Tae Ho Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/296,384

(22) Filed: Mar. 8, 2019

(65) Prior Publication Data

US 2019/0229685 A1    Jul. 25, 2019

Related U.S. Application Data

(62) Division of application No. 14/286,313, filed on May 23, 2014, now Pat. No. 10,290,501.

(30) Foreign Application Priority Data

Nov. 13, 2013 (KR) .................. 10-2013-0137625

(51) Int. Cl.
*H01L 29/66* (2006.01)
*H03F 3/183* (2006.01)
(Continued)

(52) U.S. Cl.
CPC ....... *H03F 3/183* (2013.01); *H01L 21/26586* (2013.01); *H01L 29/6659* (2013.01); *H01L 29/7833* (2013.01); *H02M 1/4258* (2013.01); *H02M 3/285* (2013.01); *H03F 1/0205* (2013.01); *H03F 1/0211* (2013.01); *H03F 2200/03* (2013.01); *Y02B 70/126* (2013.01)

(58) Field of Classification Search
CPC .................................................. H01L 29/6659
See application file for complete search history.

(56) References Cited

U.S. PATENT DOCUMENTS 5,978,270 A    11/1999  Tanaka et al.
6,114,210 A     9/2000  Wu et al.
(Continued)

FOREIGN PATENT DOCUMENTS

CN        1820372 A    8/2006
CN      101211980 A    7/2008
(Continued)

OTHER PUBLICATIONS

Chinese Office Action dated Jun. 6, 2018, in corresponding Chinese Patent Application No. 201410557919.0 (7 pages in Chinese).

(Continued)

*Primary Examiner* — Peniel M Gumedzoe
*Assistant Examiner* — Christopher A Johnson
(74) *Attorney, Agent, or Firm* — NSIP Law

(57) ABSTRACT

A semiconductor device includes a substrate comprising a WELL region, a gate electrode comprising a gate length disposed on the WELL region, and first and second drift regions which overlap with the gate electrode. The first and second draft regions may overlap with the gate electrode at an overlapping length which is a percentage of the gate length.

17 Claims, 15 Drawing Sheets

(51) Int. Cl.
  *H01L 29/78*   (2006.01)
  *H01L 21/265*  (2006.01)
  *H02M 1/42*    (2007.01)
  *H02M 3/28*    (2006.01)
  *H03F 1/02*    (2006.01)

(56) References Cited

U.S. PATENT DOCUMENTS

| | | |
|---|---|---|
| 8,598,669 B2 | 12/2013 | Hikida |
| 2003/0107081 A1 | 6/2003 | Lee et al. |
| 2004/0183080 A1 | 9/2004 | Kusumoto et al. |
| 2007/0096245 A1* | 5/2007 | Kariyama ......... H01L 21/26586 257/496 |
| 2008/0135973 A1 | 6/2008 | Hikida et al. |
| 2008/0157198 A1* | 7/2008 | Kim .................. H01L 29/66568 257/339 |
| 2009/0261409 A1 | 10/2009 | Tsai et al. |
| 2009/0321823 A1* | 12/2009 | Jung ............... H01L 21/823456 257/335 |
| 2011/0013325 A1 | 1/2011 | Kim |
| 2011/0198690 A1 | 8/2011 | Hu et al. |
| 2012/0098041 A1 | 4/2012 | Verma |
| 2012/0168869 A1 | 7/2012 | Hikida |
| 2012/0261750 A1 | 10/2012 | Yamashina et al. |
| 2015/0097226 A1 | 4/2015 | Lichtenwalner et al. |

FOREIGN PATENT DOCUMENTS

| | | |
|---|---|---|
| CN | 102484134 A | 5/2012 |
| KR | 10-0847827 B1 | 7/2008 |

OTHER PUBLICATIONS

Korean Office Action dated Mar. 28, 2019 in corresponding Korean Patent Application No. 10-2013-0137625 (7 pages in Korean).
Chinese Office Action dated May 8, 2019 in corresponding Chinese Patent Application No. 201410557919.0 (9 pages in Chinese).

* cited by examiner

SEMICONDUCTOR DEVICE AND MANUFACTURING METHOD THEREOF

CROSS-REFERENCE TO RELATED APPLICATIONS

This application is a divisional of U.S. patent application Ser. No. 14/286,313 filed on May 23, 2014, now U.S. Pat. No. 10,290,501 issued May 14, 2019, which claims the benefit under 35 U.S.C. § 119(a) of Korean Patent Application No. 10-2013-0137625 filed on Nov. 13, 2013, in the Korean Intellectual Property Office, the entire disclosures of which are incorporated herein by reference for all purposes.

BACKGROUND

1. Field

The following description relates to a semiconductor device configured to operate effectively at a medium voltage region and a manufacturing method thereof.

2. Description of Related Art

Various technologies are being developed to improve a Hot Carrier Immunity (HCl) characteristic of a device to lower a magnitude of an electric field generated around a drain of a metal-oxide-semiconductor field-effect transistor (MOSFET).

Referring to FIG. 1, a gate oxide film 12 and a gate conductive film 11 are formed on a substrate 10, and an LDD region 13 is formed by implanting dopants having a low doping concentration at a tilt angle. A sidewall spacer 14 is formed; then, a source 16 and a drain 15 are formed by implanting dopants of an N-type having a high doping concentration.

In the MOSFET structure, there is a certain limiting value for a formable LDD region length (Lo). In order to apply a sub-micron device, a gate length may be equal to or less than 55 nm, and a thickness of the gate conductive film should be equal to or less than 100 nm.

Regarding the thin gate conductive film having a thickness of less than 100 nm, the formable LDD length (Lo) has a certain limiting value. If an ion implantation with a higher energy sufficient to pass the gate electrode for formation of laterally extended LDD region is implemented, implanted dopants may penetrate into a semiconductor region under the gate electrode. As a result, an implanted LDD region is formed at the channel region under the gate. If this occurs, the transistor cannot be functional as a MOSFET.

Therefore, the more high-end technology gets, the more limitations exist for applicable energy to implant ions at a tilt angle. Accordingly, a length (Lo) of the LDD region is limited.

Furthermore, the more high-end technology gets, the more the thickness of the LDD spacer for large scale integration is reduced. For this reason, a region of high doping concentration extends to a channel region which is farther and then the channel region becomes small, such that an electric field is increased. Accordingly, Ioff and Isub.max become high when the LDD spacer becomes small.

In addition, if a length (Lo) of an LDD region is not sufficient, an electric field is concentrated at a drain and thus, a bulk current becomes large. Accordingly, the Hot Carrier Immunity (HCl) characteristic is degraded. The more high-end technology gets, the more intensified the above-mentioned problems becomes. The MOSFET used for an AMP of a driver IC requires flatness regarding a drain voltage-drain current characteristic at a low gatevoltage for a matching characteristic between transistors. But, if a bulk current increases due to an insufficient Lo, a drain current is drastically increased. Accordingly, flatness cannot be maintained, and so-called snapback is thus increased. Ultimately, an offset characteristic of an amplifier circuit is degraded, such that production of a driver IC cannot be realized.

Due to such limitations in high-end technology, a MOSFET structure having a high bulk current is not suitable for producing a transistor device necessary for a driver IC to drive an AMOLED applied to a smartphone and so forth.

That is, in order to drive an AMOLED used for a display device such as smartphones, LED TVs, PC monitors, and notebooks; the MOSFET that stably operates is required. Here, the characteristics required by the device are: 1) a probability of large scale integration, 2) a high driving current, 3) a small leakage current, 4) a low bulk current for a small snapback to be suitable for an AMP of a driver IC, and 5) a high reliability of Hot Carrier Immunity (HCl). However, as explained above, the more high-end technology gets, the greater the limitations for length (Lo) of a formable LDD region in the MOSFET structure there are. Further, due to a small spacer, an electric field is increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a substrate comprising a WELL region; a gate electrode comprising a gate length disposed on the WELL region; a first drift region which overlaps with the gate electrode by an overlapping length; and a second drift region which overlaps with the gate electrode by the overlapping length.

The semiconductor device may further include a source region and a drain region in the WELL region, wherein the first drift region may be disposed closer to the source region and the second drift region may be disposed closer to the drain region; and the overlapping length may be 5% to 25% of the gate length.

A voltage transferred to a gate and a drain of the semiconductor device may range from 6V to 9V.

The first and the second drift regions may have a concentration ranging from $0.5 \times 10^{18}$ cm$^{-3}$ to $5 \times 10^{18}$ cm$^{-3}$.

A depth of each of the first and the second drift regions may be equal to or less than 0.4 μm.

A low doping concentration of the first and the second drift regions may increase in response to the first and second drift regions being closer to a surface of the substrate, and decrease in response to the first and second drift regions being farther from the surface of the substrate.

The semiconductor device may be configured to be used for a decoder or a channel amp of a display driver.

One or more characteristics of the semiconductor device may comprise any one or a combination of a threshold voltage (Vth), a breakdown voltage between a drain-source region (BVDss), a maximum value of a substrate hole leakage current (Isub.max), and an electric field, and the semiconductor device may be configured to satisfy at least one of the one or more characteristics.

The Isub.max may be equal to or less than $3 \times 10^{-5}$ A/μm, the electric field may be equal to or less than 3.5 MV/cm, the breakdown voltage between the drain-source region (BVDss) may be equal to or greater than 10V, or a thickness of the gate may be 50 to 150 nm; and the overlapping length may be 0.05 to 0.23 μm.

A doping concentration of the second drift region of low doping concentration may be reduced by one or more orders from the surface of the substrate to a junction region in contact with a first conductive-type WELL.

In another general aspect, a semiconductor device includes a substrate; a gate electrode comprising a gate length; and a drift region which overlaps with the gate electrode.

The semiconductor device may further include a WELL region in the substrate; and a drain region and a source region in the WELL region, wherein the drift region comprises a first drift region that is disposed closer to the drain region and a second drift region that is disposed closer to the source region.

A maximum value of a substrate hole leakage current (Isub.max) may be equal to or less than $3\times10^{-5}$ A/μm, an electric field may be equal to or less than 3.5 MV/cm, a breakdown voltage between a drain-source region (BVDss) may be equal to or greater than 10V, or a thickness of the gate is 50 to 150 nm.

The drift region may overlap the gate electrode by a length of 0.05 to 0.23 μm.

In another general aspect, a method of manufacturing a semiconductor device includes forming a WELL region in a substrate; implanting conductive-type dopants in the WELL region to form a drift region; and forming a gate on the WELL region to partially overlap with the drift region.

The forming the gate on the WELL region may further include forming the gate to overlap with the drift region by an overlapping length that is 5% to 25% of a length of the gate.

Other features and aspects will be apparent from the following detailed description, the drawings, and the claims.

Figure 1:
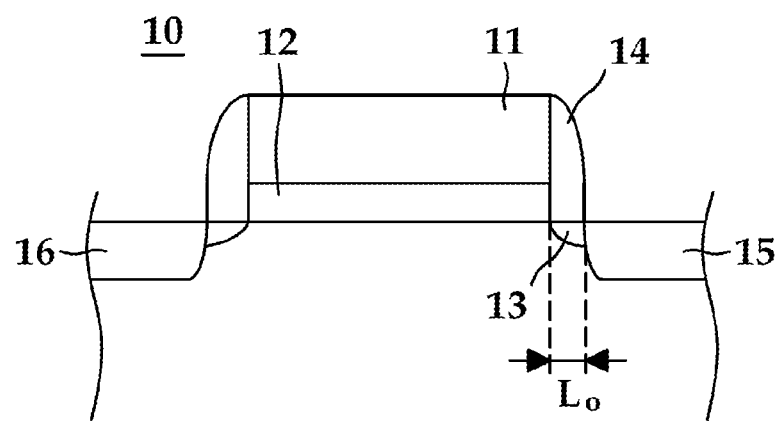
FIG. 1 is a diagram illustrating a semiconductor device according to the conventional art.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

An example of a DD-MOSFET semiconductor device will be described with reference to FIG. 2. In this example, the DD-MOSFET device is useful for a high integrated transistor configured to transfer a voltage ranging from 6 to 9V (or 7.7V) to a drain. Thus, a DD-MOSFET device is a device that is used for a display driver IC of an apparatus having a display size of 3 to 9 inches. The same voltage is applied to a gate and a drain. The DD-MOSFET device is a device that is used for a decorder or a channel AMP of a driver IC, and is suitable for a device having a gate length of at least 0.8 μm. It may be used often for a device having a gate length of 0.9 μm to 10 μm.

If a gate length becomes less than 0.8 μm, a voltage transferred to a drain would be 6 to 9V. Thus, hot carrier life-time is drastically decreased and applying the structure may cause difficulties. Also, as a gate length is reduced, a first drift region 40S and a second drift region 40D having low doping concentrations which exist thereunder are arranged to be adjacent to each other at a channel region. Accordingly, a punch-through may be generated between source region and drain region.

In order to reduce Hot-carrier life-time, a drain region 80D may be arranged to be spaced apart from a gate spacer

70. However, it is disadvantageous with high integration because a magnitude of a pitch of a unit device is increased. Thus, a drain region 80D is arranged to be directly attached to a gate spacer 70. In view of the above, such a DD-MOSFET structure is advantageous for an AMOLED display product. This is because a decorder or a channel AMP circuit is used in the AMOLED display product, and its circuit comprises about a hundred thousand to a million of NMOS and PMOS devices. It is very advantageous for high integration of a product that requires millions of devices by reducing a size of a unit device.

According to the above-mentioned demand of high integration, the DD-MOSFET device may be produced in the manner of reducing a thickness of a gate electrode. In the DD-MOSFET, a gate conductive film is formed using a polysilicon layer. Even if a thickness of the gate conductive film becomes equal to or less than 100 nm, generation of shadowing at the channel region is prevented. Further, as shown in FIG. 2, the semiconductor device can also improve characteristics of a Threshold voltage, a BVDss, and a substrate leakage current by expanding a length (Lo) of a drift region of low doping concentration 80D that is overlapped with a gate electrode 60.

Figure 2:
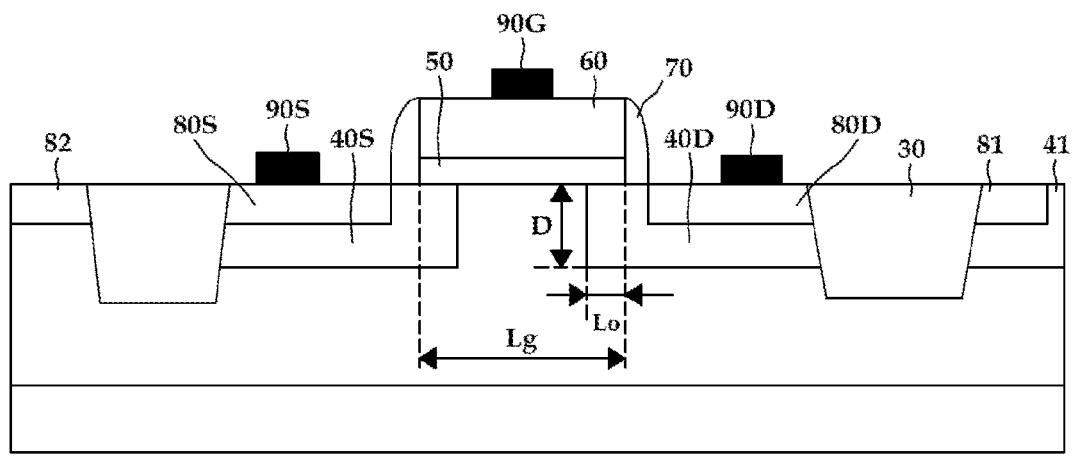
FIG. 2 is a diagram illustrating an example of a Drift Drain(DD)-MOSFET semiconductor device.

As illustrated in FIG. 2, the DD-MOSFET semiconductor device comprises a substrate 10; drift regions having low doping concentrations 40D, 40S, a gate 60, a source region 80S, and a drain region 80D.

A device isolation layer 30 and a first conductive-type WELL 20 are formed in a substrate 10. The device isolation layer 30 plays a role in defining an active area where a unit device is formed. The first conductive-type WELL 20 is formed by being doped with first conductive-type dopants. Hereinafter, an example where a P WELL is formed by selecting first conductive-type dopants of Indium (In) or Boron (B) of a P type (i.e., a case where a semiconductor device is an NMOSFET) is used as an example to explain the present disclosure.

Drift regions having low doping concentrations 40D, 40S consist of a first drift region having a low doping concentration at a source side 40S and a second drift region having a low doping concentration at a drain side 40D. These two regions 40D, 40S are formed by implanting second conductive-type dopants having low doping concentrations to be isolated from each other in a center region inside the first conductive-type WELL 20. The second conductive-type dopants may be a Phosphorous (Ph) dopant or an Arsenic (As) dopant of an N type having low diffusivity. For example, a doping concentration of the WELL 20 ranges from $1 \times 10^{16}$ to $1 \times 10^{18}/cm^3$.

In the DD-MOSFET structure, a drift region of low doping concentration 40D has a close relation with characteristics of a Threshold voltage, a BVDss, and a substrate leakage current. Thus, the characteristics of a Threshold voltage, a BVDss, and a substrate leakage current would be improved in response to a thorough designing of a dose of ions, a depth of ion implantation, and a doping concentration of ion implantation regarding the drift region of low doping concentration 40D.

For example, if a voltage which is transferred to a gate and a drain of the semiconductor device ranges from 6V to 9V, it is preferable that an overlapping length (Lo) of a region where a drift region of low doping concentration at a drain side 40D and a gate electrode 60 are overlapped ranges from 5% to 25% of a gate length (Lg). Also, it is preferable that a concentration of dopants of a drift region of low doping concentration ranges from $0.5 \times 10^{18}$ cm$^{-3}$ to $5 \times 10^{18}$ cm$^{-3}$, at a depth of about 0.1 μm from the substrate surface of the semiconductor, and that a junction depth (D) of a drift region of low doping concentration is equal to or less than 0.4 μm. Such a dose of ions, a depth of ion implantation, and a doping concentration of ion implantation regarding the drift region of low doping concentration 40D are the following.

A gate structure consists of a gate oxide film 50 and a gate conductive film 60. A sidewall spacer 70 surrounds the gate conductive film 60 and is formed on the first conductive-type WELL 20. In addition, the sidewall spacer 70 is partially overlapped with drift regions of low doping concentration 40D, 40S.

A source region 80S and a drain region 80D are formed at the side area of the gate spacer 70. The source and drain regions 80S, 80D are formed inside of drift regions of low doping concentrations 40S, 40D. A drain region 80D may spread to a substrate of silicon semiconductor under the gate spacer 70 due to dopants being spread by a thermal process. Thus, the drain region may be formed to be partially overlapped with the gate spacer 70, as may the source region 80S.

A drain region 80D may be formed to be spaced apart from the gate spacer 70. However, the number of NMOS, PMOS devices ranges from a hundred thousand to a million such that a small interval would incur a drastic increase of a device pitch. For this reason, the present disclosure is not only directed to the aforementioned structure. Such a structure is suitable for a device configured to transfer a voltage of 9, 13.5, 18, 20, and 30V to a drain and a gate. In need of a high breakdown voltage, a drain region 80D is formed to be spaced apart from a spacer 70. Accordingly, a voltage transferred to a gate and a drain ranges from 6 to 9V, and a drain region 80D is formed to be attached directly next to a spacer 70.

Source 80S is formed at an inside of a drift region of low doping concentration at a source side 40S that is exposed to one side of a gate, and a drain 80D is formed at an inside of a drift region of low doping concentration at a drain side 40D that is exposed to another side of a gate by implanting second conductive-type dopants having high doping concentration. The second conductive-type dopants may be Phosphorous (Ph) and/or Arsenic (As) dopants of an N-type. A doping concentration of the source 80S and the drain 80D is higher than that of drift regions of low doping concentration 40D, 40S in order to have lower resistance. A region at a drain side and a region at a source side are formed in a doped region of high concentration and a doped region of low concentration respectively such that a concentration phenomenon of an electric field can be prevented, which may be generated at a drain due to a rapid change of doping concentration.

A device isolation layer 30 should be formed to be deeper than drift regions of low doping concentration 40S, 40D. This is to allow for separation between devices. Also, the device isolation layer 30 may be formed to be deeper than the depth of the drain region 80D and the source region 80S. Further, as illustrated in FIG. 2, the drift region of low doping concentration and source/drain region of high doping concentrations are symmetrically formed with a device isolation layer region 30 sandwiched therebetween. That is, a drift region of low doping concentration 41 and the source or drain region 81 of high doping concentration are also formed at a right side of the device isolation layer 30. This is because an NMOS or a PMOS device is arranged repeatedly to the side.

Further, a P+ region of high doping concentration 82 that is electrically connected with a P-type WELL exists at the leftmost. This is for catching a back-bias by transferring a voltage equal to or higher than a ground to a WELL region.

Gate contact 90G, Drain contact 90D, and Source contact 90S allow for electrical connection with an outside of a unit cell.

Two methods for producing a structure as shown in the example of FIG. 2, on a basis of a process of forming a gate, include forming a drift region of low doping concentration before forming a gate (hereinafter, "DD-MOSFET") and forming a drift region of low doping concentration after forming a gate (hereinafter, "LDD-MOSFET"). These will be explained with further reference to the examples of FIGS. 3 and 4.

Figure 3:
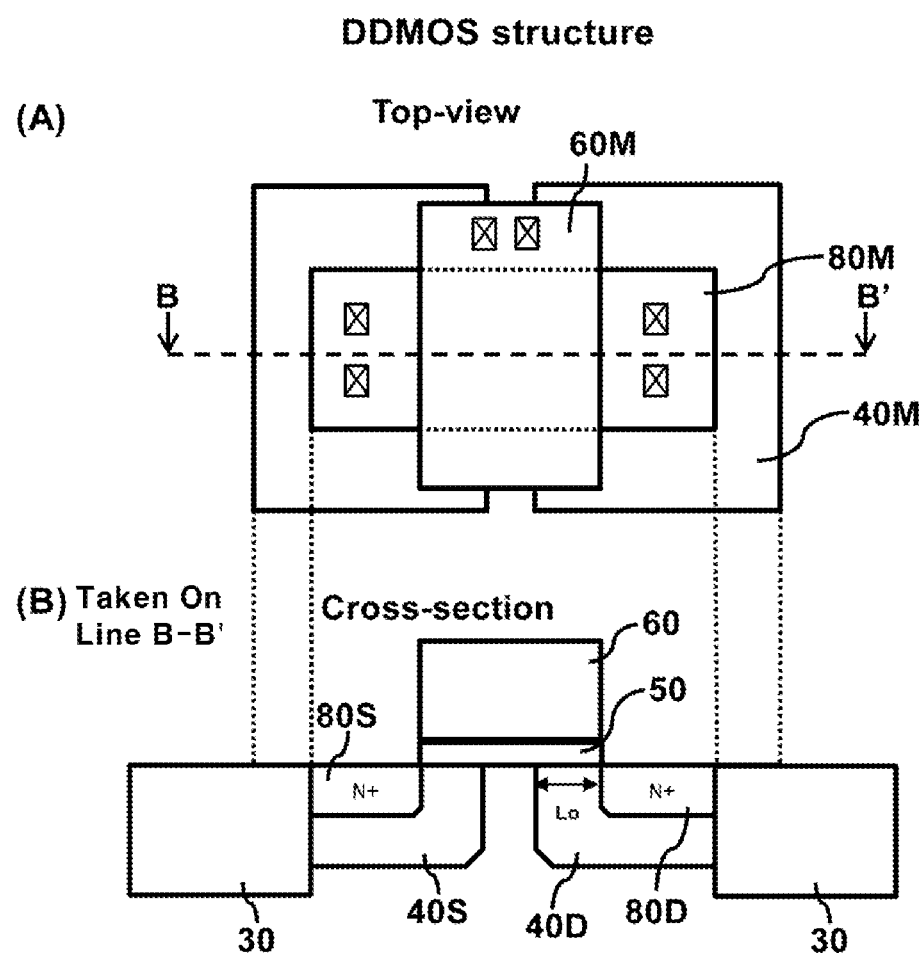
FIG. 3 is a diagram illustrating an example of a DD-MOSFET which forms a drift region of low doping concentration before forming a gate.

First, FIG. 3 is a diagram illustrating an example of a plan view of a mask layout exhibiting a DD-MOSFET which forms a drift region of low doping concentration before forming a gate. As illustrated in FIG. 3A, there is illustrated examples of a mask for forming an active area 80M, a mask for forming a drift region of low doping concentration 40M, and a mask for forming a gate electrode 60M. In a region of the mask for forming the active area 80M, source/drain regions 80S, 80D are formed later. The rest regions will be formed of the device isolation layer 30.

As illustrated in FIG. 3A, a mask for forming a drift region of low doping concentration 40M is formed to surround a mask for forming an active area 80M. The mask for forming a gate electrode 60M is partially overlapped with the mask for forming a drift region of low doping concentration 40M, and rendered in a position therebetween. A vertical extent (Y axis direction) of a mask for forming a gate electrode 60M should be within an extent of a mask for forming a drift region of low doping concentration 40M in order to reduce a size of a unit device.

In FIG. 3B, an example of a cross-sectional view taken on the line B-B' of FIG. 3A exhibiting a cross section of a device that is formed later through a mask layout. As stated above, source/drain regions 80S, 80D are formed at the active area. The rest regions will be surrounded with the device isolation layer 30 such as STI or the like. Further, since drift regions of low doping concentration 40S, 40D are implemented by an ion implantation process vertically, deeper than source/drain regions 80S, 80D, drift regions of low doping concentration 40S, 40D are formed to surround source/drain regions 80S, 80D.

Referring to FIG. 3, in the example operation of forming drift regions of low doping concentration 40D, 40S, a length (Lo) of a drift region of low doping concentration can be controlled by controlling a size of a mask for forming a drift region of low doping concentration 40M. For example, before forming a gate 60 on a P-type WELL, drift regions of low doping concentration 40D, 40S are formed using a mask. Here, by controlling a size of a mask, a length (Lo) of a drift region of low doping concentration can be controlled as the occasion demands.

In this example, even when lowering a thickness of a gate conductive film under a certain level (e.g., 100 nm) in order to apply a sub-micron device having a gate length of 55 nm or less, the Hot Carrier Immunity (HCI) characteristic can be improved by lowering an electric field of a drain side. Further, a magnitude of a leakage current can be lowered, and a certain level of snapback characteristic can be suppressed.

The snapback characteristic is a series of positive-feedback phenomenon by which a hole current generated from an electron injected from a source collides with a lattice by being accelerated around a drain LDD due to a maximum electrical field. The collision increases a substrate voltage and thereby a source/substrate voltage is formed in a forward direction and thereby a drain current is more amplified. With regard to an AMP of a smartphone driver IC, it is important that drain voltage-drain current characteristic (VD-ID) be flat, particularly at a low gate voltage.

Additionally, at a low gate voltage, a current level is low due to weak channel formation. Thus, a small bulk current would degrade flatness of VD-ID easily. Improving snapback characteristic by reducing a bulk current would be a core technology of MOSFET for a smartphone driver IC.

Figure 4:
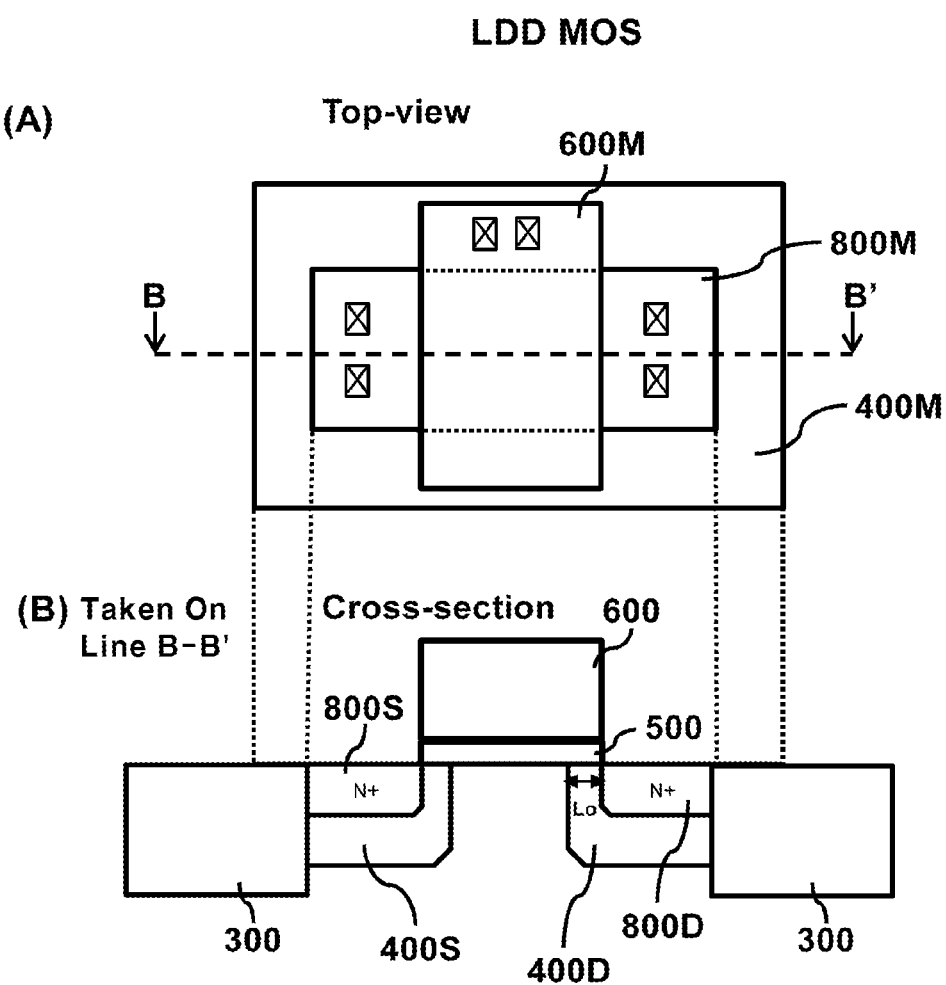
FIG. 4 is a diagram illustrating an example of an LDD-MOSFET which forms a drift region of low doping concentration after forming a gate.

In contrast, FIG. 4 is a diagram illustrating a plan view of an LDD-MOSFET which forms a drift region of low doping concentration after forming a gate. FIG. 4A illustrates examples of a mask for forming an active area 800M, a mask for forming an LDD region 400M, and a mask for forming a gate electrode 600M. Source/drain regions 800S, 800D are formed in the mask region for forming the active area 800M later. The rest regions will be formed of the device isolation layer 300.

As illustrated in FIG. 4A, a mask for forming an LDD 400M is formed to surround a mask for forming an active area 800M. FIG. 4B is a cross-sectional view taken on line B-B' of FIG. 4 (A) exhibiting a cross-section of a device that is formed later through a mask layout. As stated above, source/drain regions 800S, 800D are formed in the active area. The rest regions will be surrounded with the device isolation layer 300 such as STI or the like. The LDD regions 400S, 400D are implemented by an ion implantation process vertically, deeper than the source/drain regions 800S, 800D. Thus, the LDD regions 400S, 400D are formed to surround the source/drain regions 800S, 800D.

It should be appreciated that there is a difference with FIG. 3B in that after forming a gate 600 in a P WELL, the LDD regions 400D, 400S are formed by a tilt ion implantation process using the gate 600 as a mask thus, a length ($L_o$) of the formable LDD regions 400D, 400S has a certain limited value.

For example, in order to apply a sub-micron device of 55 nm or less for large scale integration, a thickness of a gate conductive film should be thin under a certain level. By use of a gate 600 having a small thickness as a mask, in order to form the LDD regions 400D, 400S, an ion implantation process is implemented by use of energy beyond a certain level.

BVDss characteristics are degraded by the generation of Poly-Si Ion Penetration phenomenon by which dopants penetrate into a region under a gate 600 and a P-type WELL at a gate bottom is doped, where a channel should be formed.

Therefore, the more high-end technology gets, the more limitations exist for the energy for a tilt ion implantation method. Accordingly, a length ($L_o$) of the formable drift region of low doping concentration becomes limited.

Moreover, the more high-end technology gets, the smaller the LDD spacer becomes. Thus, an interval between a region of high doping concentration and a channel becomes narrow such that an electric field is increased. That is, if a length ($L_o$) of a drift region of low doping concentration becomes short, an electric field is concentrated to a drain side, such that a bulk current becomes big, a snapback is then increased and, a Hot Carrier Immunity (HCI) characteristic is thus degraded.

Hereinafter, methods for producing a DD-MOSFET and an LDD-MOSFET will be explained with reference to the accompanying drawings respectively. FIGS. 5 to 9 are diagrams illustrating an example of a method of manufacturing a DD-NMOSFET semiconductor device using a drift-drain structure (DD).

Figure 5:
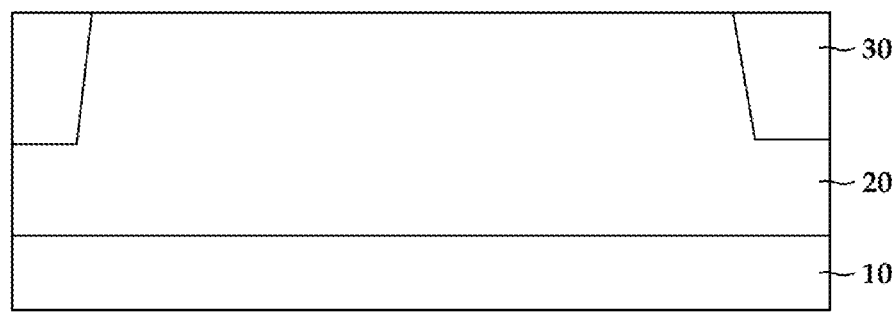
FIGS. 5, 6, 7, 8, and 9 are diagrams illustrating an example of a manufacturing method of a semiconductor device.

Referring to FIG. 5, in the operation of providing a substrate, a substrate 10 formed of a first conductive-type WELL 20 is provided. Specifically, in the substrate 10 provided at this operation, there is a device isolation layer 30 configured to define an active area where a unit device is formed, and a first conductive-type WELL 20 doped with first conductive-type dopants. For example, a depth of a device isolation layer 30 is equal to or more than 300 nm.

Hereinafter, an example in which a P-type WELL is formed by selecting Boron (B) of a P type as first conductive-type dopants (i.e., a semiconductor device is an NMOSFET) will be explained. Of course, the present disclosure may be applied to a method for producing PMOSFET in regards to forming an N WELL by selecting an N type dopant as first conductive-type dopants. Here, a doping concentration of the WELL 20 should be $1\times10^{16}$ to $1\times10^{18}/\text{cm}^3$. However, the doping concentration is not limited thereto.

Figure 6:
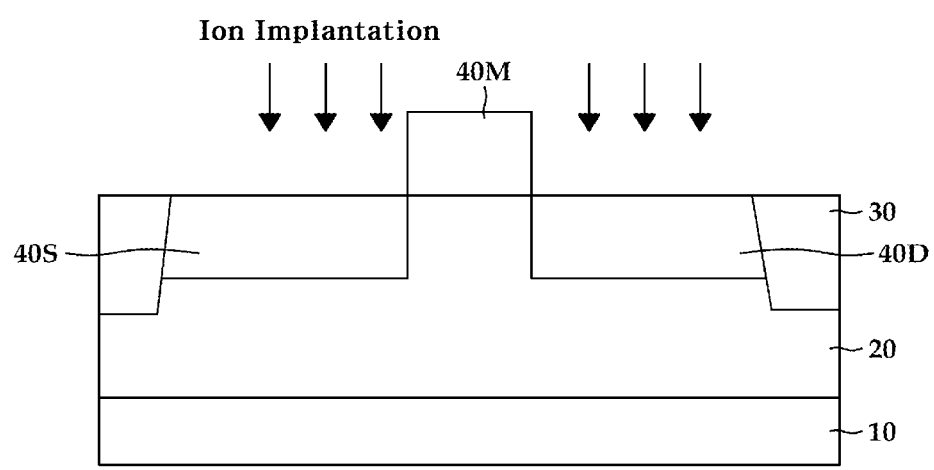

Referring to FIG. 6, in the operation of forming a drift region of a low doping concentration, drift regions of low doping concentrations 40D, 40S are formed with second conductive-type dopants having low doping concentrations by an ion implantation to be isolated from each other at a center region of a first conductive-type WELL 20. The second conductive-type dopants may be of Phosphorous (Ph) atom, which is an N-type having low diffusivity.

Specific examples of the process that can be applied to form such drift regions of low doping concentration 40D, 40S will be described as follows in detail.

First, a mask for forming a drift region of low doping concentration 40M is formed so as to form drift regions of low doping concentration 40D, 40S at an upper portion of a substrate 10 in which a first conductive-type WELL 20 is formed. A mask for forming a drift region of low doping concentration 40M is formed at a surface of a substrate 10 that is positioned vertically to an upper portion of a center region of a first conductive-type WELL 20 where a channel is formed.

Next, by implanting second conductive-type dopants having low doping concentrations to an inside of a first conductive-type WELL 20 where a mask for forming a drift region of low doping concentration 40M is formed on the surface, two drift regions of low doping concentrations 40D, 40S, isolated from each other with a center of a first conductive-type WELL 20 being sandwiched therebetween, are formed. That is, drift region of low doping concentration at a drain 40D and drift region of low doping concentration at a source 40S are formed respectively at a drain and a source. The drift region of low doping concentration at a source 40S is the first drift region of low doping concentration, and the drift region of low doping concentration at a drain 40D is the second drift region of low doping concentration.

During the ion implantation, energy of 30 to 50 KeV is applied at a dose of 1E11 to 1E14 $\text{cm}^{-2}$ by taking into account a junction depth of a drift region of low doping concentration. A drift region of low doping concentration is implemented by an ion implantation vertically to a substrate, without a tilt angle. A rapid thermal process (RTP) is then implemented for activation of dopants, at the temperature of 800° C. to 1100° C. If an ion implantation is implemented under such conditions, a concentration of dopants would be 0.5 to 5.0E18 $\text{cm}^{-3}$ at a depth of 0.1 μm from the substrate surface of the semiconductor. Further, a junction depth of the drift of low doping concentration in contact with the P-type WELL becomes equal to or less than 0.4 μm. A semiconductor device having outstanding characteristics may be produced if the doping concentration and the junction depth are satisfied. Accordingly, a junction depth of a drift region of low doping concentration may be formed to be thinner than a depth of a device isolation layer. This is in order to provide separation from an adjacent DD-MOS device.

In an example, in the operation of forming a drift region of low doping concentration by controlling a size of a mask for forming a drift region of low doping concentration 40M, a size of the drift regions of low doping concentration 40D, 40S can be controlled. Once the above-mentioned operation of forming the drift regions of low doping concentration 40D, 40S is implemented, a drift region of low doping concentration at a drain side 40D and a drift region of low doping concentration at a source side 40S are formed to be isolated from each other. A center region, being a channel region sandwiched inside a P WELL 20, is formed therebetween.

Figure 7:
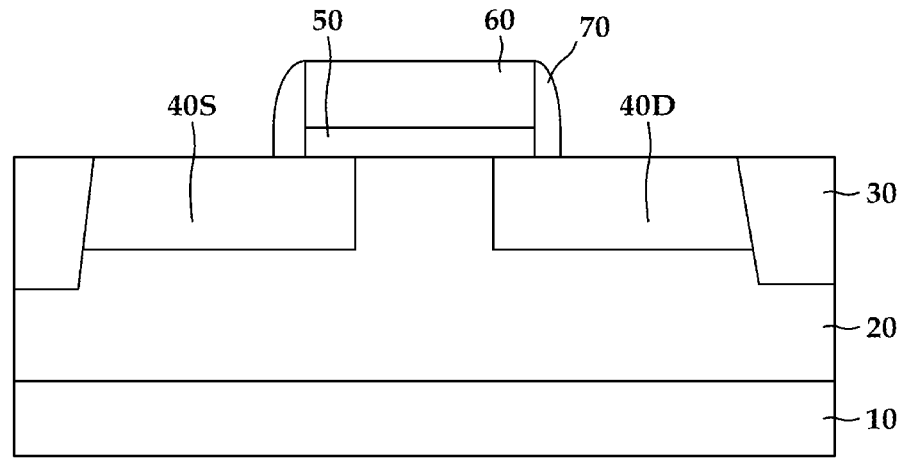

As illustrated in FIG. 7, a gate insulator 50 and a gate conductive film 60 are formed at the upper portion of a region where they are overlapped with parts of the drift regions of low doping concentration at a drain side 40D and a source side 40S including the center region of the P WELL 20. A sidewall spacer 70 is then formed at a gate conductive film 60. A thickness of the gate insulator 50 should be 10 to 30 nm so as to endure a voltage of 6 to 9 V. A gate conductive film 60 may be formed using polysilicon; however, the material of the gate conductive film 60 is not limited thereto. A thickness of the gate conductive film 60 may be formed to be 150 nm or less for a high speed motion, such as 50 to 150 nm. However, the thickness of the gate conductive film 60 is not limited thereto.

Figure 8:
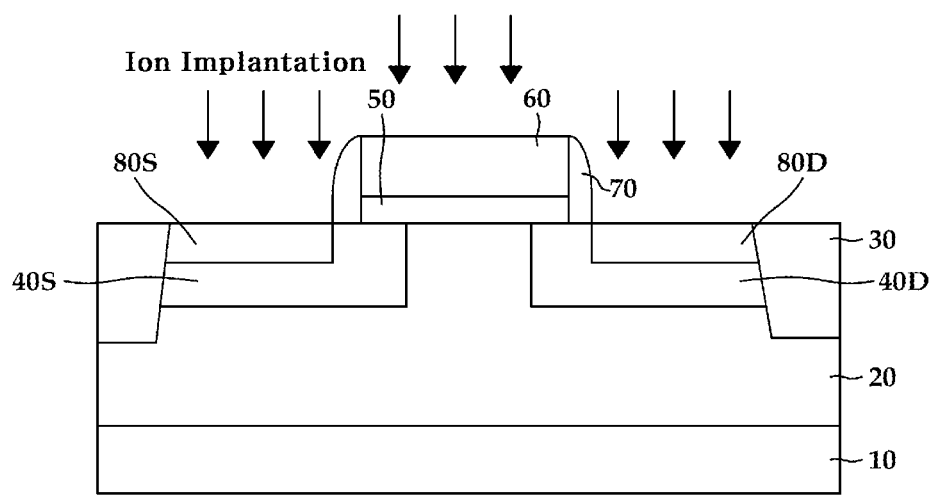

As illustrated in FIG. 8, source 80S and drain 80D are formed with second conductive-type dopants having high doping concentrations inside of drift regions of low doping concentrations 40D, 40S that are exposed to both sides of a gate. As discussed above, the second conductive-type dopants may be of Phosphorous atom (PH) of an N type. In order to form source 80S and drain 80D, source 80S and drain 80D are formed by applying a doping concentration higher than a doping concentration applied to form drift regions of low doping concentrations 40D, 40S.

The energy for an ion implantation with regard to source and drain should be smaller than that for forming the drift region of low doping concentration. In this example, Arsenic (As) dopant is used in an ion implantation at 50 KeV. Subsequently, phosphorous dopant is used in an ion implantation at 25 KeV. A size of dose of Arsenic (As) dopant is 1E14 $\text{cm}^{-2}$ to 1E16 $\text{cm}^{-2}$, and dose of phosphorous is 1E12 $\text{cm}^{-2}$ to 1E14 $\text{cm}^{-2}$, in the ion implantation, but is not limited thereto. Source/drain regions are implemented without tilt ion implantation, like the ion implantation at drift regions of low doping concentration. That is, the ion implantation is applied vertically to a substrate. Further, the size of a dose should be at least greater than the size of a dose of the drift region of low doping concentration. Also, the source and drain regions pass through annealing briefly, at the temperature of 1000° C. or more, by the rapid thermal processing (RTP) method for spreading the dopants.

Once the operations as above are performed, a region at a drain side and a region at a source side are constituted with a doped region of high concentration and a doped region of low concentration, respectively. Accordingly, a concentration phenomenon of an electric field can be prevented, which may be generated at a drain side due to a rapid change of concentration.

Figure 9:
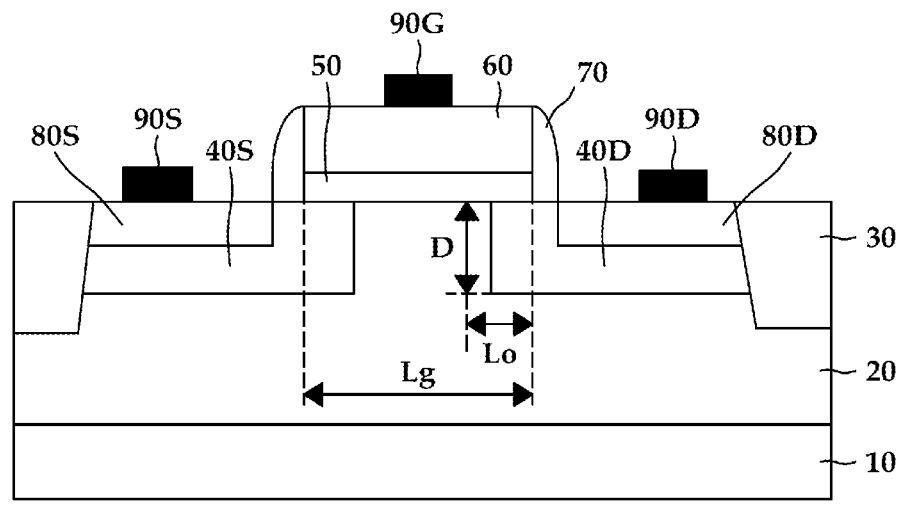

Referring to FIG. 9, a contact plug may be formed as illustrated in this example. An insulating film (not illustrated) is formed at an entire surface of the semiconductor by use of a BPSG, and a masking process is implemented for formation of a contact to connect electrically with an outside of a unit cell. The reference numeral 90G denotes gate contact, 90D denotes drain contact, and 90S denotes source contact. A ratio (Lo/Lg %) at which a drift region of low doping concentration and a gate overlap is defined by dividing a length (Lo) for which a drift region of low doping concentration at a drain side 40D and a gate are overlapped by a gate length (Lg). After performing the above-mentioned processes of this example, an NMOSFET in a method of Drift Drain (DD) having an extended length is produced.

Figure 10:
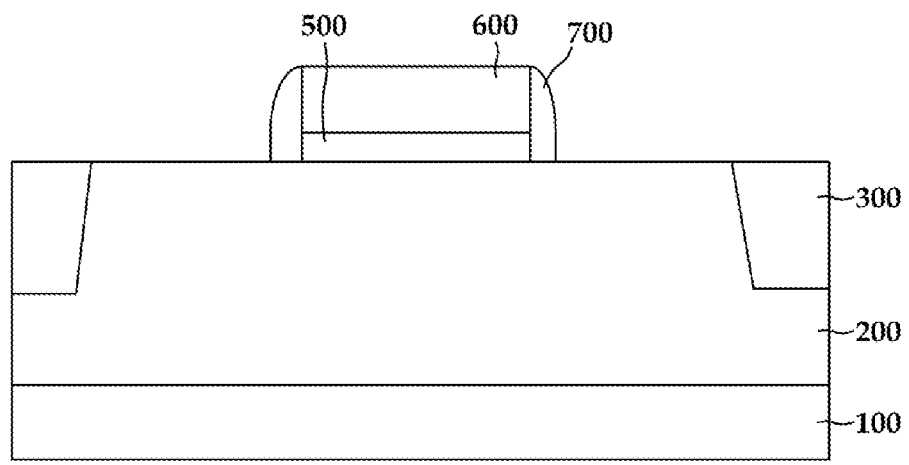
FIGS. 10, 11, and 12 are diagrams illustrating an example of a manufacturing method of a semiconductor device.
Figure 11:
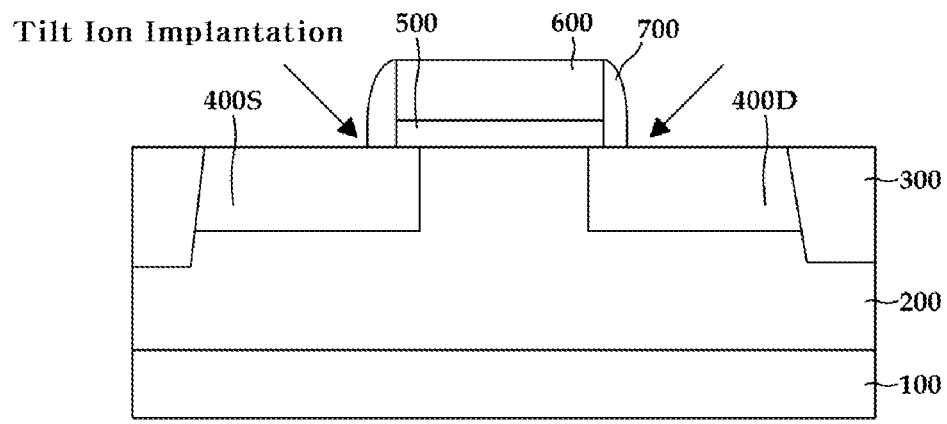
Figure 12:
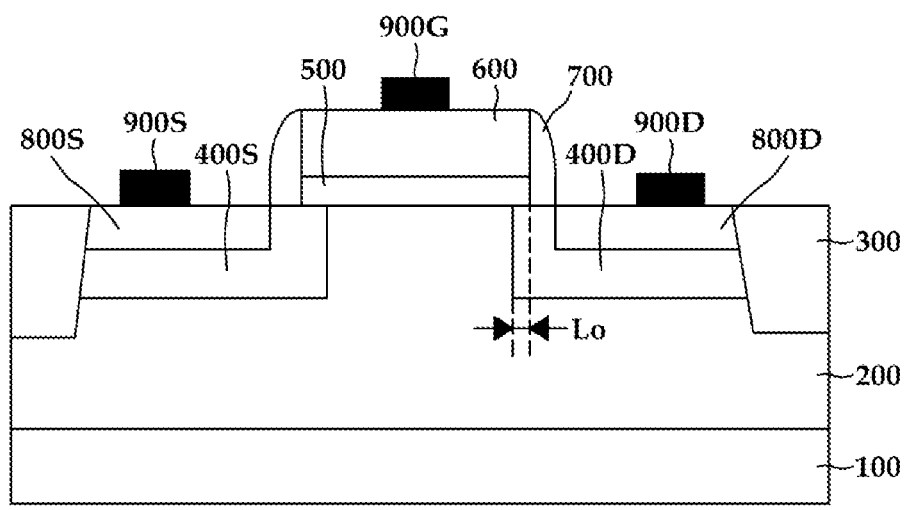

FIGS. 10 to 12 are diagrams illustrating an example of a manufacturing method of an LDD-NMOSFET semiconductor device produced by an LDD method corresponding. Referring to FIG. 10, a P WELL 200 is formed in a substrate 100 in which a device isolation layer 300 is formed. A gate insulator 500 and a gate conductive film 600 are then formed on the P WELL. A doping concentration of the P WELL and a thickness of the gate insulator 500 and the gate conductive film 600 may be the same as discussed above with regards to the DD-MOSFET.

Referring to FIG. 11, LDD regions 400D, 400S are formed with dopants of an N type having low doping concentrations by a tilt ion implantation. Unlike the DD-MOSFET, the tilt ion implantation is implemented. Due to a thinness of the gate, high energy for an ion implantation should not be used. In this example, an ion implantation may be implemented with energy of 60 to 80 KeV, at dose of 1E11 to 1E13 cm$^{-2}$. Further, for a tilt ion implantation, an angle of 20 to 50 degree may be applied. In doing so, a laterally extended LDD region is formed by an ion implantation even at a bottom portion of a gate conductive film or a gate electrode to the fullest. In addition, thermal treatment is conducted during 10 to 60 minutes, at the temperature of 700 to 900° C., in order to spread and activate dopants.

Referring to FIG. 12, a sidewall spacer 700 is formed at a gate conductive film 600. Thereafter, source 800S and drain 800D are formed with dopants of an N type having high doping concentrations by an ion implantation using a gate as a mask. Contacts 900G, 900D, 900S are formed for an electrical connection.

Though not illustrated, a logic device or an SRAM device which operates at 1.5 V similarly therewith may be formed simultaneously.

Hereinafter, characteristics of a DD (drift drain)-NMOSFET and an LDD (Lightly Doped Drain)-NMOSFET will be described.

Figure 13:
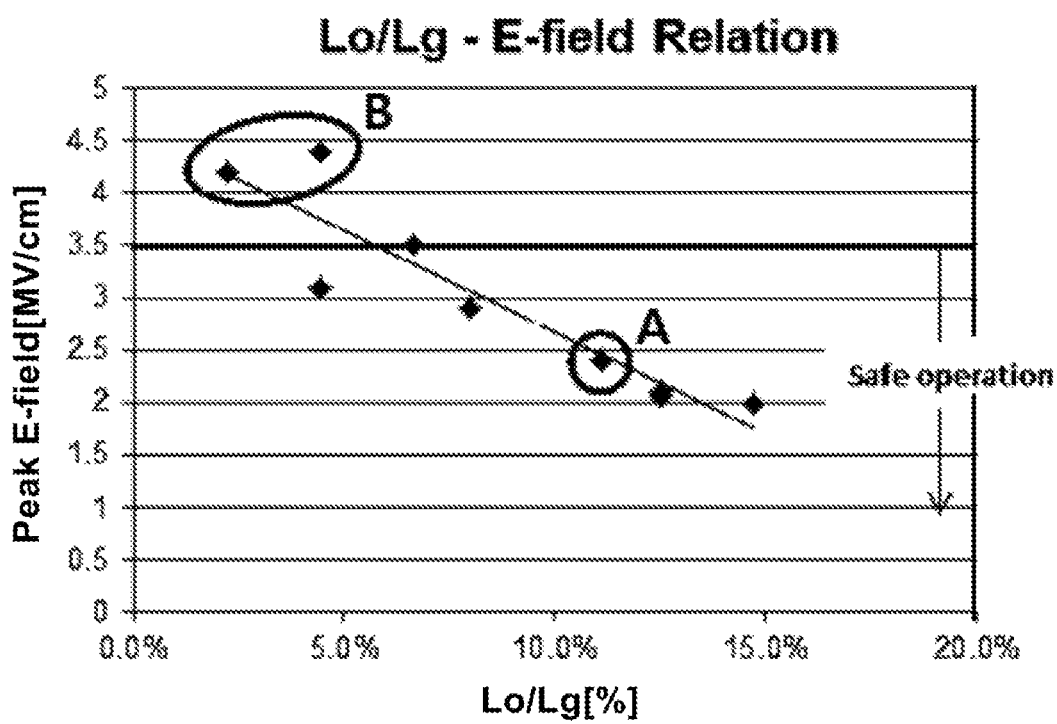
FIG. 13 is a diagram illustrating an example for explaining a correlation between a ratio at which a drift region of low doping concentration and a gate are overlapped, and a concentration phenomenon of an electric field.

FIG. 13 is a diagram illustrating an example for explaining a correlation between a ratio at which a drift region of low doping concentration and a gate are overlapped and a concentration phenomenon of an electric field. Referring to FIG. 13, it should be appreciated that according to a ratio (Lo/Lg) at which a drift region of low doping concentration and a gate overlap, an electric field generated at a drain side is changed. That is, the bigger the ratio of a length (Lo) at which a drift region of low doping concentration at a drain side and a gate overlap becomes versus a gate length (Lg), the lower an electric field generated at a drain side becomes. If the electric field is rendered low, the HCl characteristic is improved.

In an example, referring to reference numeral A of FIG. 13, when a thickness of a gate conductive film that constitutes the DD-NMOSFET is 100 nm and a ratio (Lo/Lg) at which a drift region of low doping concentration and a gate are overlapped is 11%, if a voltage of 7.7V is transferred to a drain, a maximum value of an electric field generated at a drain side is 2.4 (MV/cm). Given that a maximum value of an electric field allowed for safe operation of a device is generally 3.5 (MV/cm), this experimental value may be regarded as appropriate.

The reference numeral B of FIG. 13 indicates a maximum value of an electric field higher than 3.5 (MV/cm). The lower the ratio of the overlapped length is, the greater the electric field. A region in which a device cannot be applied is indicated.

As illustrated in FIG. 13, it is important that an electric field value be 3.5 (MV/cm) or less for safe operation of the device. To satisfy this condition, a ratio of a drift drain length overlapped with a gate electrode versus a gate length (Lo/Lg) should be at least 5%. Thus, a maximum value of an electric field can be 3.5 (MV/cm) or less. In this example, if a gate length (Lg) is 1.0 μm, a length (Lo) value should be at least 0.05 μm. If the gate length becomes less than 5%, a maximum value of an electric field becomes 3.5 (MV/cm) or more. Accordingly, breakdown voltage of a device is lowered and thus, the device cannot be functional.

Figure 14:
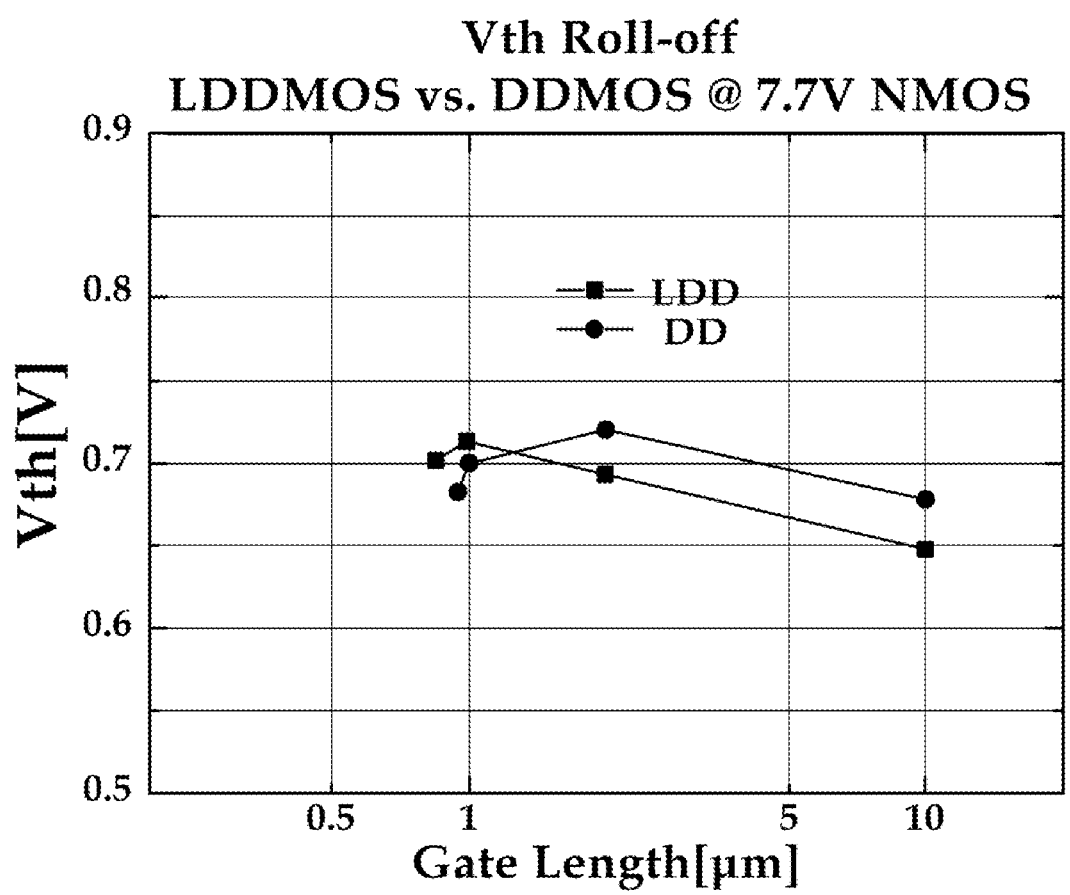
FIG. 14 is a diagram illustrating an example of a way to compare a relation between a gate length and a Threshold voltage.

FIG. 14 is a diagram illustrating a way to compare a gate length and a Threshold voltage, in a case where a voltage of 7.7V is transferred to drain of an LDD-NMOSFET and a DD-NMOSFET. In a case where a gate length (Lg) is approximately 0.9 μm, the Threshold voltage (Vth) is set up with 0.7V as an approximate target value. Referring to FIG. 14, a roll-off characteristic of the Threshold voltage (Vth) is excellent at around 0.9 μm for both LDD-NMOSFET (LDD) and the DD-NMOSFET (DD). It may be understood that both the LDD-NMOSFET structure and the DD-NMOSFET structure satisfy the target value. It may be understood that the existing driver IC designed in the LDD-MOS can be directly changed to a DD-MOS, without modifying a circuit design.

Figure 15:
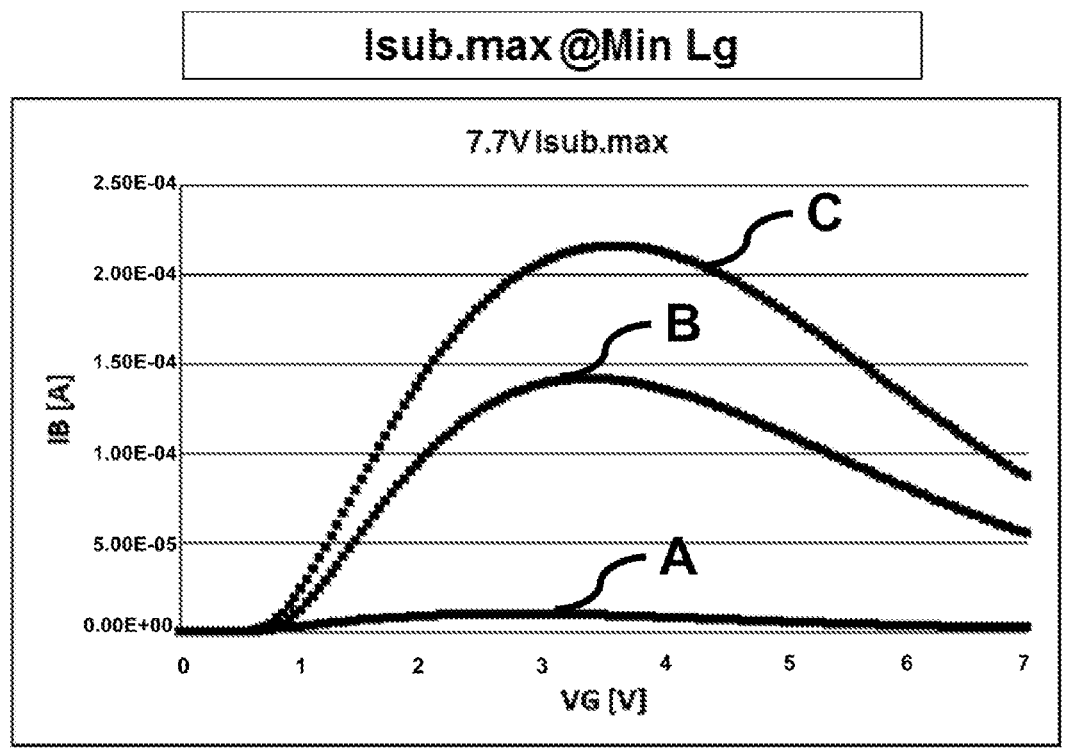
FIG. 15 is a diagram illustrating an example of a way to compare a relation between a gate voltage and a substrate leakage current.

FIG. 15 is a diagram illustrating a way to compare a gate voltage and a bulk current due to a hole. More specifically, a maximum value of a substrate hole leakage current (Isub.max) is depicted. DD-NMOSFET (A) shows Isub.max [μA/μm] of $10^{-5}$ A/μm level, at a point of Vd=7.87V. In contrast, LDD-NMOSFET(B, C) show $10^{-4}$ A/μm or more. Therefore, in the DD-NMOSFET device, the Isub.max value is diminished under one order of a magnitude in comparison with the LDD-NMOSFET.

Figure 16:
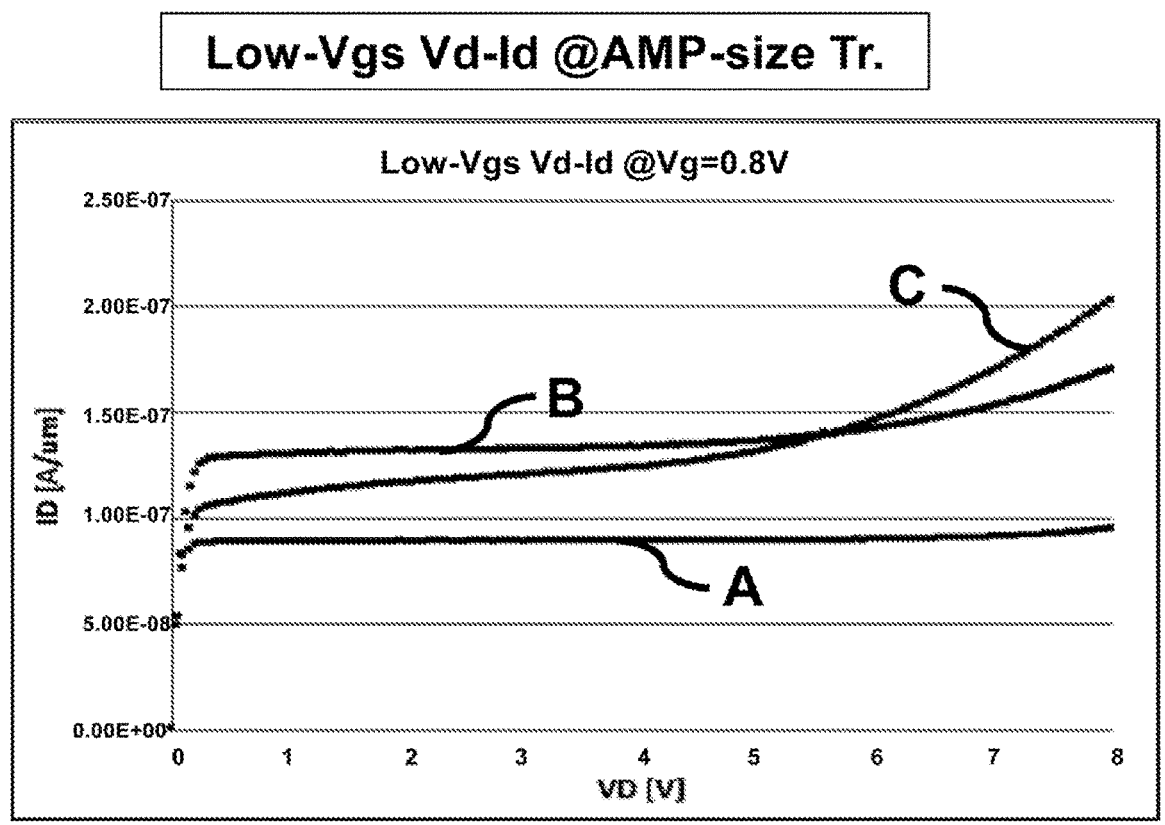
FIG. 16 is a diagram illustrating an example of a relation between a drain voltage and a drain current.

FIG. 16 is a diagram illustrating an example of a relation between a drain voltage and a drain current. Referring to reference numerals B and C of FIG. 16, with regards to an LDD-NMOSFET, when a drain current is relatively flat to a drain voltage while a drain voltage exceeds approximately 6V, a drain current is drastically increased. In contrast, referring to reference numeral A of FIG. 16, with regards to an DD-NMOSFET, even if a drain voltage exceeds approximately 6V, a drain current is characterized by being flat without being influenced by a drain voltage and has a stable value at overall sections.

Therefore, the DD-MOSFET device can be recognized as a core technique for showing a stable drain current having few offsets when used for a channel AMP of a smartphone driver IC. Further, it is expected that a drain voltage-drain current characteristic (VD-ID) and an HCl characteristic at a low gate voltage may be improved sufficiently.

Figure 17:
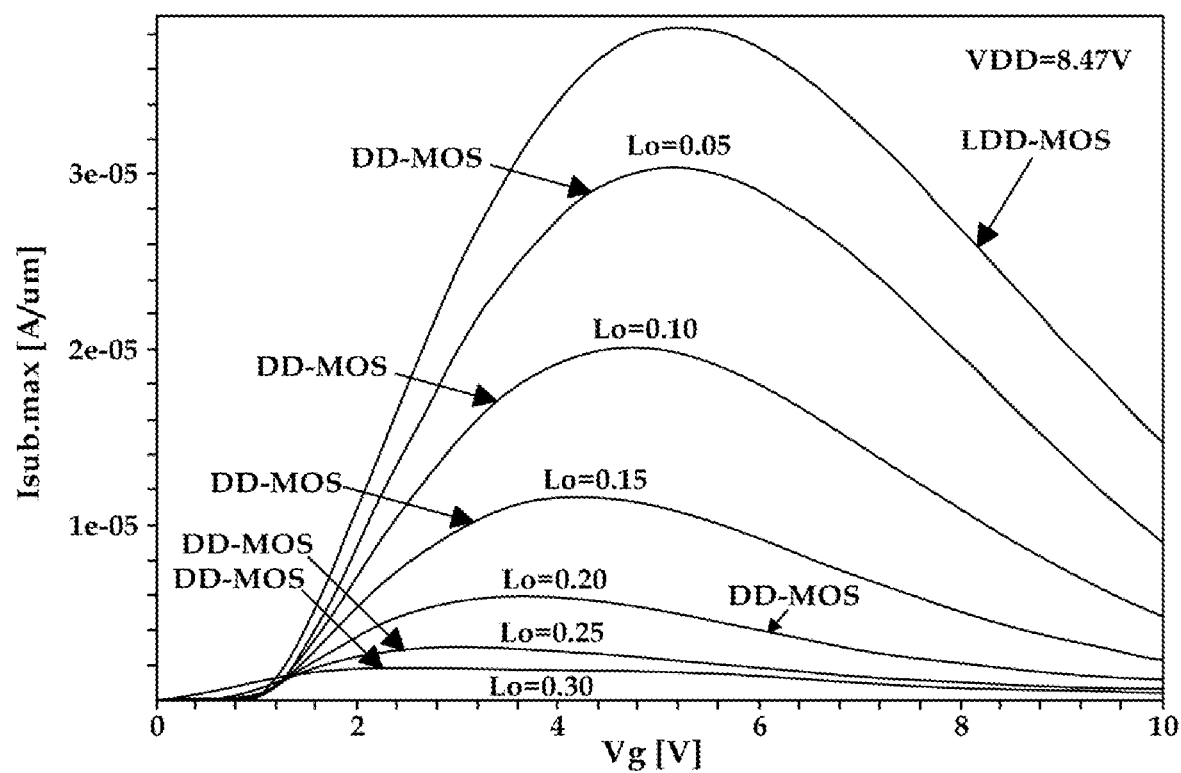
FIG. 17 is a diagram illustrating an example of a correlation between a gate voltage and an Isub.max according to a length (Lo) of a region where a drift region of low doping concentration and a gate are overlapped.

As explained above, the DD-MOSFET structure is superior to the LDD-MOSFET structure in various aspects. Accordingly, the example of a DD-MOSFET will be used for explanation. FIG. 17 is a diagram illustrating an example of a correlation between a gate voltage and an Isub.max according to a length (Lo) for which a drift region of low doping concentration and a gate are overlapped in the DD-MOSFET structure. Isub.max is a maximum of substrate leakage current. In this example, Isub.max may be assessed at 1.1*VDD.

Referring to FIG. 17, with regards to the NMOSFET produced by the LDD method, when a drain voltage is at 1.1VDD=8.47V, a bulk current change is large according to a change of a gate voltage and a bulk current value is generally very large at an applicable gate voltage area. This is based on an HCl reliability of 1.1*VDD. In contrast, with regards to the NMOSFET produced by a DD method corresponding to various aspects, as a length (Lo) of a region where a drift region of low doping concentration and a gate are overlapped becomes longer, Isub.max satisfies $3 \times 10^{-5}$ A/μm or less.

Figure 18:
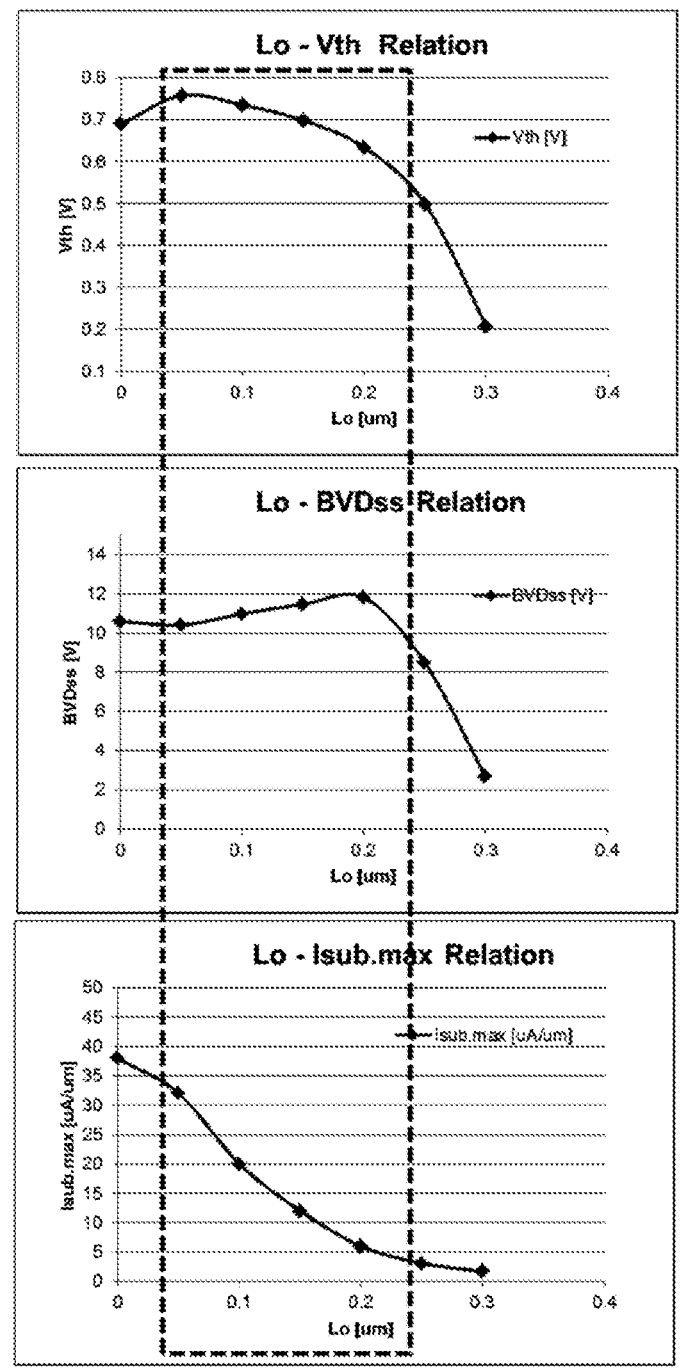
FIG. 18 is a diagram illustrating an example of an optimal Lo section which satisfies all of Vth, BVDss, Isub.max characteristics.

As illustrated in FIG. 18, an optimal length (Lo) section is demonstrated which satisfies all demand characteristics of a Threshold voltage (Vth), a BVDss, and an Isub.max. Specific experimental results thereof are provided in Table 1. Table 1 is drawn up on a basis of a gate length (Lg) of 0.9 μm.

TABLE 1

| Lo [μm] | Lo/Lg (%) | Vth [V] | Idsat [μA/μm] | Ioff [A/μm] | BVDss [V] | Isub.max [μA/μm] |
|---|---|---|---|---|---|---|
| 0 | 0.0 | 0.69 | 489 | 4.00E−14 | 10.6 | 38 |
| 0.05 | 5.6 | 0.758 | 477 | 2.48E−14 | 10.4 | 32 |
| 0.10 | 11.1 | 0.735 | 503 | 2.80E−14 | 11.0 | 20 |
| 0.15 | 16.7 | 0.698 | 537 | 3.72E−14 | 11.5 | 12 |
| 0.20 | 22.2 | 0.633 | 580 | 1.80E−13 | 11.8 | 6 |
| 0.25 | 27.8 | 0.498 | 636 | 1.29E−10 | 8.5 | 3.1 |
| 0.30 | 33.3 | 0.208 | 714 | 5.58E−06 | 2.7 | 1.7 |

Referring to FIG. 18 and Table 1, the Lo section where all Vth, BVDss, Isub.max are allowed to have optimal level values will be described as follows. When an (Lo) section is 0.05 to 0.23 μm (i.e., a case where Lo/Lg (%) section is 5 to 25%), the Threshold voltage (Vth) gradually descends in inverse proportion to Lo. When the length (Lo) is 0.05 μm, the Threshold voltage (Vth) is approximately 0.750V and when the length (Lo) is 0.21 μm, the Threshold voltage (Vth) is approximately 0.598V. If a length (Lo) exceeds 0.23 μm, Vth drastically decreases. Thus, sections where Lo exceeds 0.23 μm may be inappropriate.

When a length (Lo) section is 0.05 to 0.23 μm, a breakdown voltage between drain and source regions BVDss gradually ascends in proportion to Lo; however, due to a small ascent gradient, the BVDss has a flat characteristic in general. At this section, in a case where a length (Lo) is 0.08 μm, the BVDss is approximately 10.7V and in a case where a length (Lo) is 0.21 μm, the BVDss is approximately 11.1V. If Lo exceeds 0.23 μm, the BVDss drastically descends to be less than 10 V. Thus, sections where Lo exceeds 0.23 μm may bw inappropriate. Therefore, Lo should be designed in such a manner that BVDss value is at least 10 V.

For example, the bigger Lo becomes, the shorter a channel length becomes. If Lo exceeds 0.23 μm and a channel length becomes excessively shorter, a depleted layer from a drain and a source moves to a substrate area under a gate. For this reason, a potential barrier at the channel portion is degraded. Accordingly, due to a slight increase of a drain voltage, a drain current is drastically increased and punch-through is generated by a contact of a depleted layer.

In a case where the Lo section is 0.05 μm to 0.23 μm, a substrate leakage current Isub.max is characterized by having an inverse proportion to Lo. When Lo is 0.08 μm, Isub.max is approximately 25 μA/μm, and when Lo is 0.21 μm, Isub.max is approximately 5 μA/μm. The smaller Isub.max is, the better the characteristics of a semiconductor device are. Nevertheless, taking into account the above described characteristics of Vth and BVDss together, it may be understood that an optimal Lo section is approximately 0.05 μm to 0.23 μm. Converted to Lo/Lg (%), a section ranging from 5 to 25% is optimal. More narrowly, Lo/Lg (%) of 10 to 23% is the most optimal.

Figure 19:
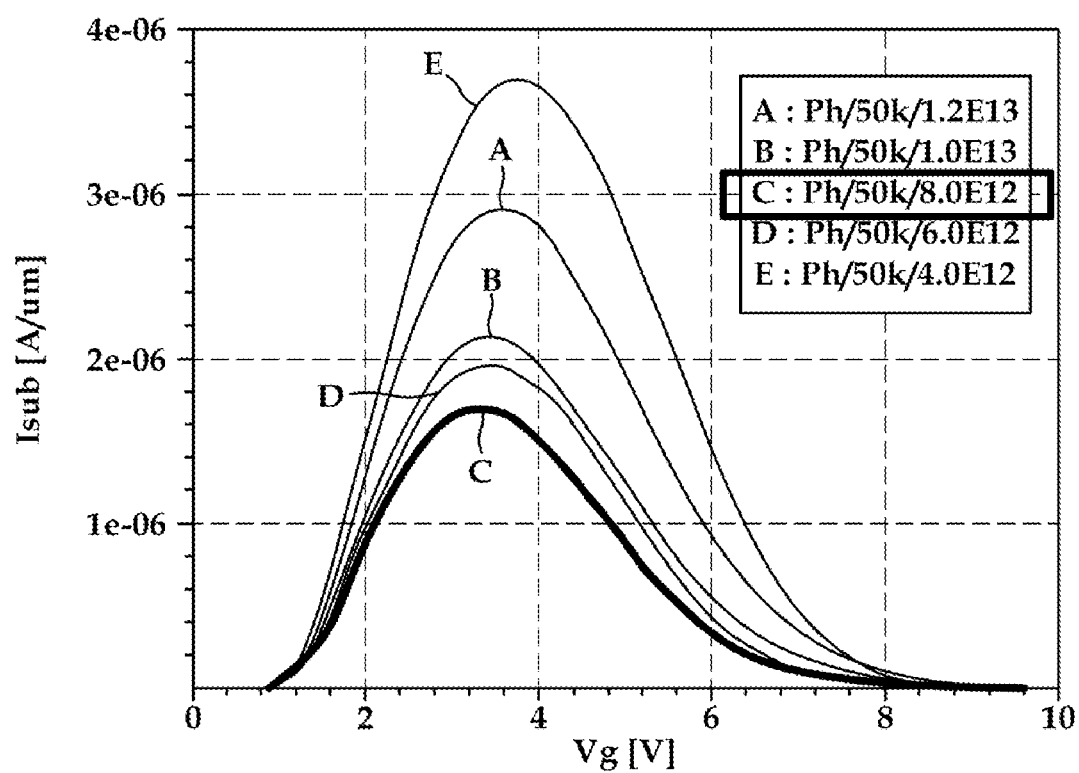
FIG. 19 is a diagram illustrating an example of a relation between a gate voltage and a substrate leakage current according to Lo and a doping concentration of a drift region of low doping concentration.

Additionally, an example experiment associated with comparing a gate voltage and a substrate leakage current for doping concentrations of drift regions of low doping concentration is illustrated in FIG. 19. It may be found that there is an optimal doped section (C) that can lower Isub.max. More specifically, reference numeral C denotes a case where a drift region of low doping concentration is doped with energy of 50 KeV, at a dose of 8.0E12 $cm^{-12}$, when Lo is 0.15 μm. It would be understood that Isub.max is the lowest in C, when compared with A, B, D, and E in which a doping concentration equal to or higher than C is used. Through the experimental results, it should be appreciated that there is an optimal doped section that can minimize Isub.max. This experimental result is obtained by comparing a drain leakage current (IDOFF), in a case where a drain voltage is at 1.1VDD=8.47V. It may be understood that approximately 3 orders are reduced when using DD method in comparison with LDD method. This originates from the effect of a reduction of an electric field in a DD method, corresponding to a result about a bulk current.

Figure 20:
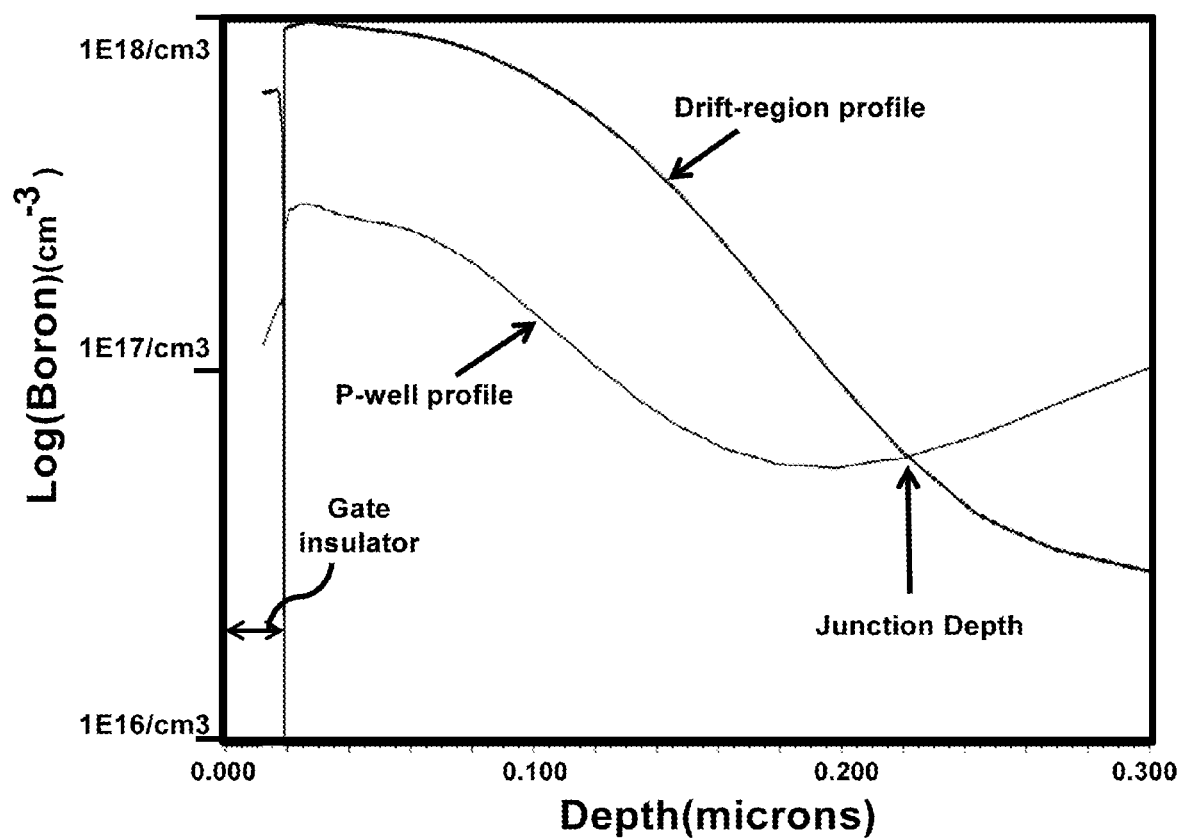
FIG. 20 is a diagram illustrating an example of a junction depth according to doping concentration profiles of a WELL and a drift region of low doping concentration.

FIG. 20 is a diagram illustrating an example of a junction depth according to doping concentration profiles regarding a WELL and a drift region of low doping concentration.

Referring to FIG. 20, a drift region of low doping concentration at a drain side is doped with phosphorus (Ph) dopant and a P WELL is doped with Boron (B) dopant. The X-axis indicates a depth from a substrate surface of the semiconductor. The section from 0 to 0.02 μm indicates a gate insulator formed on a semiconductor substrate. The sections over 0.02 μm indicate an active area underneath the gate insulator. It is preferable that a junction depth of a drift region of low doping concentration is equal to or less than 0.4 μm, given the doping concentration profiles. As illustrated in FIG. 20, a junction depth is approximately 0.23 μm, which falls within that section. If the depth exceeds 0.4 μm, the exceeded amount would spread horizontally. Thus, this would be dangerous, in that a punch-through may be generated.

A doping concentration of a drift region of low doping concentration becomes higher as it is closer to a surface of the substrate, and lower as it is far away therefrom. A doping concentration ranges from 1E17 to 1E19 $cm^{-3}$. Specifically, around a depth of 0.1 μm from a substrate surface, a doping concentration of a drift region of low doping concentration ranges from $0.5 \times 10^{18}$ to $5 \times 10^{18}$ $cm^{-3}$. Under such doping concentration condition, Isub.max, BVDss, Ioff characteristics can be satisfied. Also, the doping concentration of the drift region of low doping concentration is reduced by one or more orders, from the substrate surface to the junction region in contact with the P-type WELL.

In contrast, a doping concentration of a P-type WELL is lower than that of a drift region and is generally reduced up to the junction region (boundary of N-drift/P WELL) and increased after the junction region. A doping concentration of a P WELL is reduced within one or less order in comparison with a doping concentration of a drift region of low doping concentration.

Through the above-mentioned experiments and an example of the semiconductor device, when a voltage transferred to a gate and a drain thereof ranges from 6V to 9V, a length (Lo) of a region where a drift region of low doping concentration and a gate are overlapped preferably ranges from 5% to 25% of a gate length (Lg), a concentration of dopants of a drift region of low doping concentration preferably ranges from $0.5 \times 10^{18}$ to $5 \times 10^{18}$ cm$^{-3}$, and a junction depth (D) of a drift region of low doping concentration is preferably equal to or less than 0.4 μm.

In various aspects, a semiconductor device improves high integrated transistor device's characteristics such as a Threshold voltage (Vth), a breakdown voltage (BVDss), and a substrate leakage current (Isub), and improves the manufacturing method thereof.

For example, with regards to a high integrated transistor device configured to transfer a voltage of about 7.7V to a drain, even if a thickness of a gate conductive film becomes low beyond a certain level as required by a high integration, generation of shadowing at the channel region can be prevented. Further, characteristics of a bulk current, a snapback and an HCI reliability can also be improved thereby expanding a length of a drift region of low doping concentration.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a semiconductor device, comprising:
    forming a WELL region in a substrate;
    implanting conductive-type dopants in the WELL region to form a first drift region and a second drift region;
    forming a gate on the WELL region, the first drift region and the second drift region;
    forming a sidewall spacer adjacent to the gate; and
    forming a source region to extend from a boundary of the sidewall spacer,
    wherein a mask for forming the first drift region and the second drift region surrounds a mask for forming an active region, and the source region and a drain region are formed in the active region.

2. The method of claim 1, wherein the forming the gate on the WELL region further comprises forming the gate to overlap the first drift region or the second drift region by an overlapping length that is 5% to 25% of a length of the gate.

3. The method of claim 1, wherein the spacer does not overlap a virtual center line of the gate.

4. The method of claim 1, wherein, in a top view of the substrate, the mask for forming the first drift region and the second drift region has a first portion spaced apart from a second portion, and the first and second drift regions are formed in the first and second portions, respectively.

5. The method of claim 4, wherein, in the top view of the substrate, each of the first portion and the second portion partially overlaps a mask for forming the gate.

6. The method of claim 1, further comprising forming a first trench isolation and a second isolation in the substrate, wherein each of the first trench isolation and the second isolation has a depth deeper than a depth of the first drift region and a depth of the second drift region.

7. The method of claim 1, wherein the mask for forming the first drift region and the second drift region extends over a device isolation layer, such that the mask overlaps the device isolation layer.

8. A method of manufacturing a semiconductor device, comprising:
    forming a WELL region in a substrate;
    implanting conductive-type dopants in the WELL region to form a first drift region and a second drift region;
    forming a gate on the WELL region, the first drift region and the second drift region;
    forming a sidewall spacer adjacent to the gate; and
    forming a source region to extend from a boundary of the sidewall spacer, wherein, in a top view of the substrate, a mask for forming the first drift region and the second drift region has a maximum vertical length greater than a maximum vertical length of a mask for forming the gate.

9. A method of manufacturing a semiconductor device, comprising:
    forming a WELL region in a substrate;
    implanting conductive-type dopants in the WELL region to form a drift region;
    forming a gate on the WELL region;
    forming a sidewall spacer adjacent to the gate; and
    forming a first region in the WELL region to extend from a boundary of the sidewall spacer;
    wherein the drift region partially encloses the first region, completely overlaps an entire length of the sidewall spacer, and partially overlaps a length of the gate,
    wherein a mask for forming the drift region surrounds a mask for forming an active region, and the first region is formed in the active region.

10. The method of claim 9, wherein the spacer does not overlap a virtual center line of the gate.

11. The method of claim 9, wherein, in a top view of the substrate, the mask for forming the drift region has a maximum vertical length greater than a maximum vertical length of a mask for forming the gate.

12. The method of claim 9, wherein, in a top view of the substrate, the mask for forming the drift region has a first portion spaced apart from a second portion.

13. The method of claim 12, wherein, in the top view of the substrate, each of the first portion and the second portion partially overlaps a mask for forming the gate.

14. The method of claim 9, further comprising forming a first trench isolation and a second isolation in the substrate, wherein each of the first trench isolation and the second isolation has a depth deeper than a depth of the drift region.

15. The method of claim 9, wherein, in a top view of the substrate, the mask for forming the drift region extends over a device isolation layer, such that the mask overlaps the device isolation layer.

16. The method of claim 9, wherein, in a top view of the substrate, the mask for forming the drift region has a lateral length greater than a length between device isolation layers.

17. The method of claim 9, wherein the first region is a drain region or a source region.

* * * * *